United States Patent
Kubota

(10) Patent No.: US 7,157,880 B2
(45) Date of Patent: Jan. 2, 2007

(54) BATTERY MONITORING SYSTEM

(75) Inventor: Akihiro Kubota, Kokubunji (JP)

(73) Assignee: Olympus Corporation, Tokyo (JP)

( * ) Notice: Subject to any disclaimer, the term of this patent is extended or adjusted under 35 U.S.C. 154(b) by 0 days.

(21) Appl. No.: 11/103,321

(22) Filed: Apr. 11, 2005

(65) Prior Publication Data

US 2005/0231167 A1 Oct. 20, 2005

(30) Foreign Application Priority Data

Apr. 16, 2004 (JP) .............................. 2004-121620

(51) Int. Cl.
*H02J 7/00* (2006.01)
(52) U.S. Cl. .............................. 320/106; 320/DIG. 21; 396/279
(58) Field of Classification Search ................ 320/106, 320/109, 112, DIG. 18, DIG. 21; 368/96; 324/427; 396/277, 278, 279, 301
See application file for complete search history.

(56) References Cited

U.S. PATENT DOCUMENTS

| | | | | |
|---|---|---|---|---|
| 5,420,830 A | * | 5/1995 | Camaratta et al. | ............ 368/96 |
| 6,690,366 B1 | * | 2/2004 | Kitahashi | .................... 345/211 |
| 2003/0011704 A1 | * | 1/2003 | Sawachi | ..................... 348/372 |
| 2003/0185913 A1 | * | 10/2003 | Pushpangadan et al. | .... 424/739 |
| 2004/0051497 A1 | * | 3/2004 | Richards et al. | ............ 320/103 |
| 2004/0185913 A1 | * | 9/2004 | Aoshima et al. | ............ 455/566 |

FOREIGN PATENT DOCUMENTS

| | | |
|---|---|---|
| JP | 2000-032100 | 1/2000 |
| JP | 2003-153453 | 5/2003 |

* cited by examiner

*Primary Examiner*—Karl Easthom
*Assistant Examiner*—Samuel Berhanu
(74) *Attorney, Agent, or Firm*—Volpe and Koenig, P.C.

(57) ABSTRACT

A battery monitoring system including a first device powered by a first battery, a second device powered by a second battery and operated in conjunction with the first device, a first information generating portion that generates a first information indicating the state of the first battery, a second information generating portion that generates a second information indicating the state of the second battery, and an information selecting portion that selects and outputs at least one of the first information and the second information.

2 Claims, 6 Drawing Sheets

BATTERY MONITORING SYSTEM

BACKGROUND OF THE INVENTION

Priority is claimed on Japanese Patent Application No. 2004-121620, filed Apr. 16, 2004, the contents of which are incorporated herein by reference.

1. Field of the Invention

The present invention relates to a battery monitoring system for monitoring the states of device batteries in a system in which a plurality of devices provided with batteries operate in coordination.

2. Description of Related Art

When displaying the remaining capacity of a battery in a battery-powered video camera and the like, the current remaining capacity with respect to the full charge capacity has conventionally been shown by a five-level battery-shaped mark or by the remaining recording time in minutes. FIG. 6 shows an example of a system in which a plurality of devices provided with batteries operate in coordination. FIG. 6 is a block diagram showing the schematic structure of a conventional imaging system provided with a camera. This imaging system includes a camera 1A, a recording device 2A, and a monitor 3A, with each constitution shown in the drawing explained below.

The camera 1A is a professional-use video camera such as a television camera. An imaging portion 10A in the camera 1A images a subject and generates image data constituting a moving image. A battery 11A supplies driving power to each portion in the camera 1A. A display portion 12A, which functions as a finder, displays the image picked up by the imaging portion 10A. The display portion 12A displays the state of battery 11A together with the image. A control portion 13A outputs the image data generated by the imaging portion 10A to the recording device 2A via an interface not shown.

The control portion 13A detects the voltage of the battery 11A and calculates the remaining capacity of the battery 11A based on this voltage. The control portion 13A calculates as needed the remaining time that the camera 1A can run on the battery 11A (remaining operating time) based on the remaining capacity of the battery 11A. Also, the control portion 13A combines the display data, for displaying the remaining capacity and remaining operating time in the display portion 12A, with the image data, and, based on the combined data, generates an image signal for driving the display circuit in the display portion 12A and outputs it to the display portion 12A.

A battery 20A in the recording device 2A supplies driving power to each portion in the recording device 2A. A control portion 21A stores image data output from the camera 1A and input via the interface in a storage unit such as a hard disk drive not shown. It also outputs the image data to the monitor 3A via another interface not shown. The control portion 21A detects the voltage of the battery 20A and calculates the remaining capacity of the battery 20A based on this voltage. The control portion 21A calculates as needed the remaining time that the recording device 2A can run on the battery 20A based on the remaining capacity of the battery 20A.

The control portion 21A creates display data for displaying the remaining operating time in a display portion 22A and, based on this display data, generates a display signal for driving the display circuit in the display portion 22A and outputs it to the display portion 22A. The display portion 22A displays the remaining operating time based on the display signal. The monitor 3A displays an image based on the image data output from the recording device 2A. While there are cases of the recording device 2A not being provided with the display portion 22A, the explanation given here assumes the case of the display portion 22A being provided.

With the aforementioned constitution, the remaining capacity of the battery 11A and the remaining operating time that is possible with the remaining capacity are shown in the display portion 12A of the camera 1A. The display portion 12A displays the remaining capacity, which is indicated for example by a battery mark, and the remaining operating time to be 30 minutes. In addition, the display portion 22A of the recording device 2A displays the remaining operating time, during which operation is possible with the remaining capacity of the battery 20A, to be 50 minutes.

Japanese Unexamined Application, First Patent Publication No. 2000-32100 and Japanese Unexamined Application, First Patent Publication No. 2003-153453 disclose technology for monitoring the state of a battery. Japanese Unexamined Application, First Patent Publication No. 2000-32100 discloses technology to monitor the voltages of batteries in a device provided with at least 2 batteries, select the battery having the least remaining capacity that exceeds a reference voltage level, and switch to the selected battery. Japanese Unexamined Application, First Patent Publication No. 2003-153453 discloses technology in which a small electrical apparatus powered by a secondary battery informs external equipment of the remaining capacity of the secondary battery, and the informed external equipment displays the remaining capacity of the secondary battery of the small electrical apparatus.

In the conventional system shown in FIG. 6, each device equipped with a battery shows the remaining capacity (or remaining time) of its battery. Because the camera 1A and the recording device 2A are powered by their own batteries, the user must therefore individually check the remaining battery level of each device. In the example shown in FIG. 6, the camera 1A has 30 minutes of remaining operating time with the battery 11A, while the recording device 2A has 50 minutes of remaining operating time with the battery 20A. Therefore, the remaining operating time for the entire system that can record images picked up by the camera 1A on the recording device 2A is 30 minutes.

SUMMARY OF THE INVENTION

The battery monitoring system of the present invention is provided with a first device powered by a first battery; a second device powered by a second battery and operated in conjunction with the first device; a first information generating portion that generates a first information indicating the state of the first battery; a second information generating portion that generates a second information indicating the state of the second battery; and an information selecting portion that selects and outputs at least one of the first information and the second information.

The first information may indicate the remaining operating time of the first device by the first battery; the second information may indicate the remaining operating time of the second device by the second battery; and the information selecting portion may compare the first information and the second information and, based on the comparison result, select and output the first information or the second information.

In this case, a display portion may be provided for displaying information output from the information selecting portion; and the information selecting portion may compare the remaining time indicated by the first information and the remaining time indicated by the second information, and select and output the lower of the two.

In addition, a display portion for displaying information output from the information selecting portion and a detecting portion for detecting the operating state of the first device and the operating state of the second device may be provided, and, based on the result of comparing the first information and the second information and the detection result by the detecting portion, either of the first information or the second information may be selected and output.

Also, the information selecting portion may select and output the first information and the second information instructed by the user.

A power source switching portion may also be provided that supplies power from the second battery to the first device when the remaining capacity of the first battery is below a predetermined amount, and supplies power from the first battery to the second device when the remaining capacity of the second battery is below a predetermined amount.

DETAILED DESCRIPTION OF THE INVENTION

Figure 1:
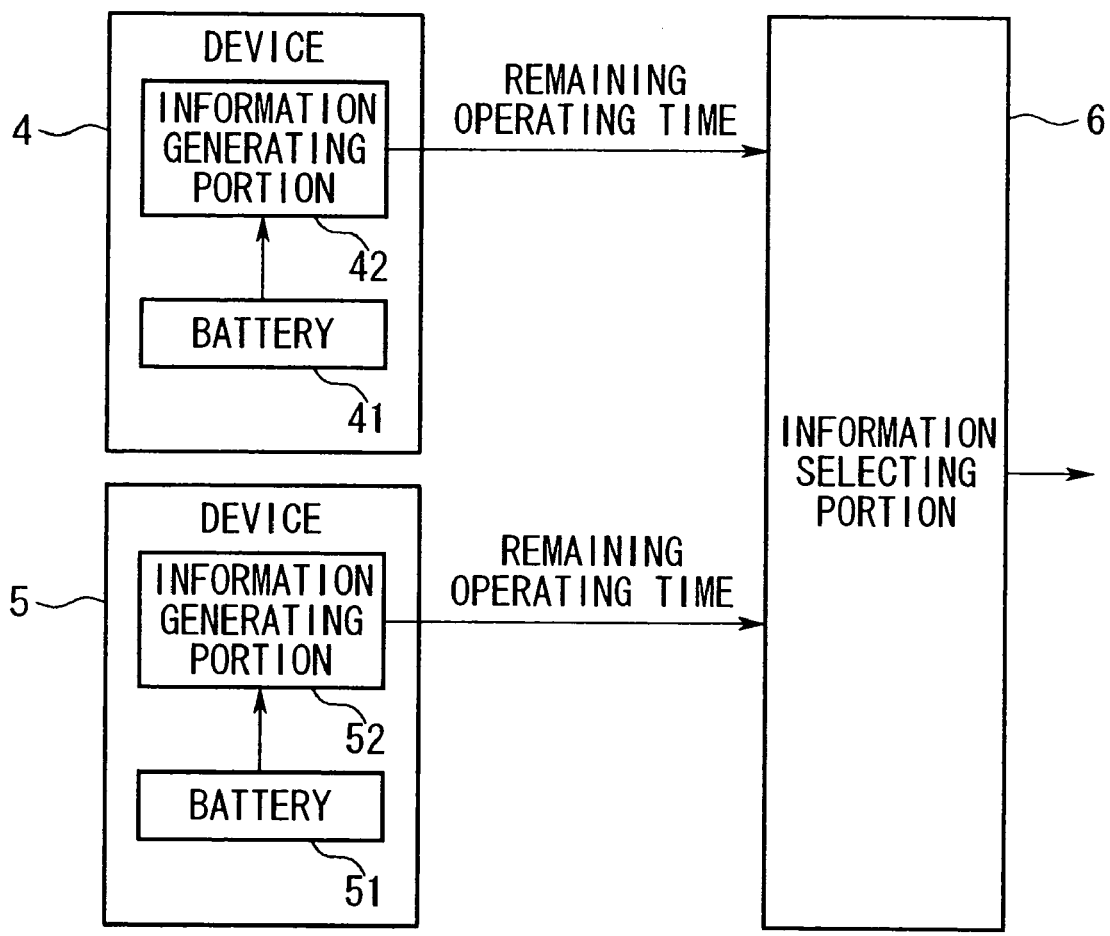
FIG. 1 is a block diagram showing the constitution of the battery monitoring system according to a first embodiment of the present invention.

Below, a first embodiment of the present invention is explained referring to FIG. 1, which is a block diagram showing the constitution of the battery monitoring system according to this embodiment.

The battery monitoring system of the present embodiment is provided with a device 4, a device 5 and an information selecting portion 6, with each constitution in the drawing explained below.

A battery 41 supplies driving power to each portion in the device 4. An information generating portion 42 detects the voltage of the battery 41, calculates the remaining capacity of the battery 41 based on this voltage, and calculates the remaining operating time indicating the remaining time of operation of the device 4 based on the remaining capacity. The information generating portion 42 generates information indicating this remaining operating time and outputs it to the information selecting portion 6. The function of the information generating portion 42 is realized by, for example, a central processing unit. A battery 51 and an information generating portion 52 are provided in the device 5 similarly to the battery 41 and the information generating portion 42 in the device 4.

The information selecting portion 6 selects and outputs at least one of the two pieces of information showing the remaining operating time of each device output from the device 4 and the device 5. For example, the information selecting portion 6 compares the remaining operating time of the device 4 and the remaining operating time of the device 5 and selects and outputs the lower of the two. The information selecting portion 6 may be housed in a device other than the device 4 and the device 5, or it may be housed inside the device 4 or the device 5.

Figure 2:
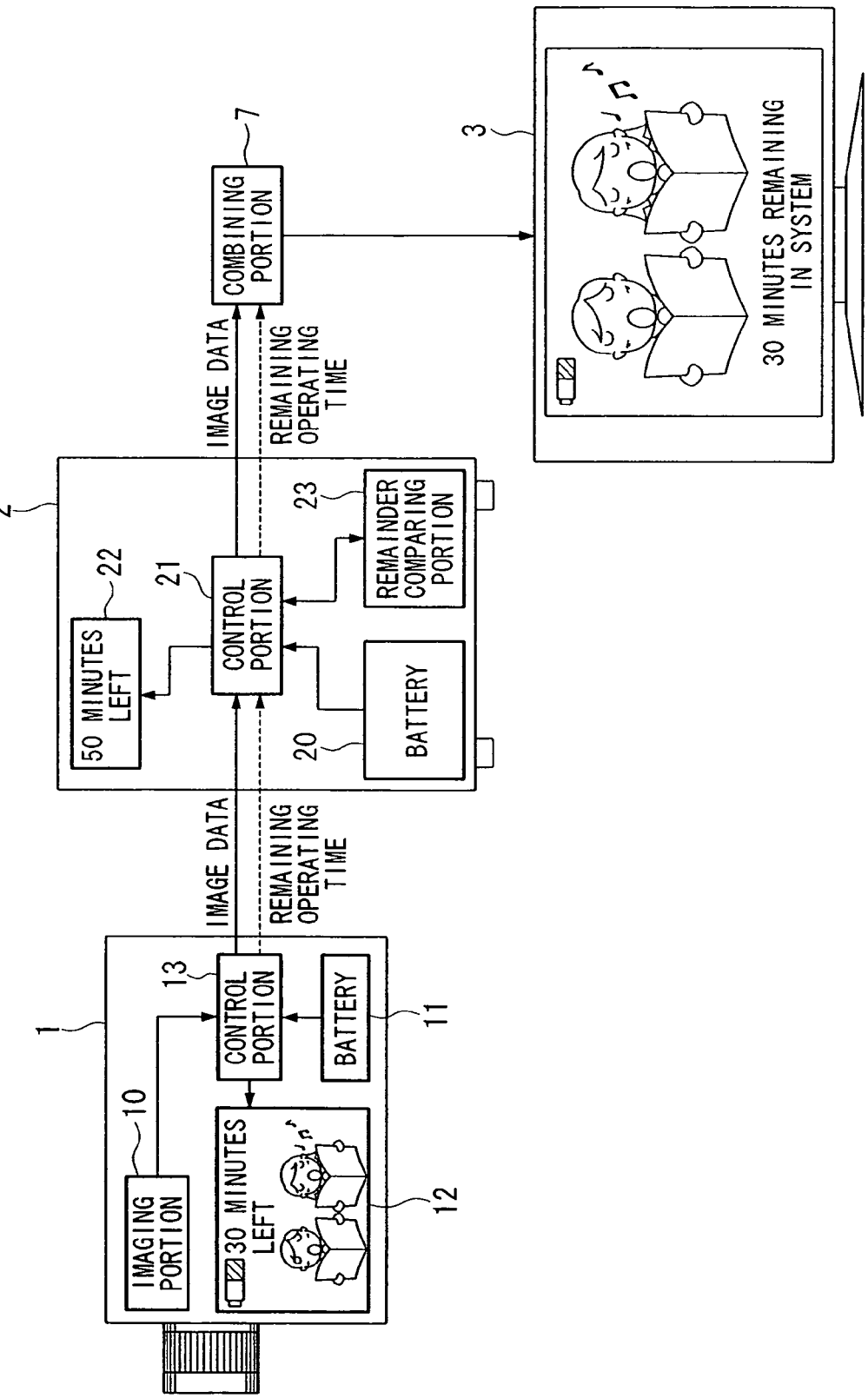
FIG. 2 is a block diagram showing the constitution of the battery monitoring system according to a second embodiment of the present invention.

Next, a second embodiment of the present invention is explained. FIG. 2 is a block diagram showing the constitution of the battery monitoring system according to this embodiment. This battery monitoring system is provided with a camera 1, a recording device 2, a monitor 3 and a combining portion 7, with the camera 1 and the recording device 2 operating in coordination by sending and receiving information to and from each other. In the present embodiment, the remaining operating time of the camera 1 with a battery 11 (hereafter, remaining operating time A) is 30 minutes, while the remaining operating time of the recording device 2 with a battery 20 (hereafter, remaining operating time B) is 50 minutes. In this case, the remaining operating time of the entire system in the mode in which both the camera 1 and the recording device 2 are operating is 30 minutes.

Each constitution shown in FIG. 2 is explained below. In the camera 1, an imaging portion 10 images a subject and generates image data constituting a moving image. The battery 11 supplies driving power to each portion in the camera 1. A display portion 12, which functions as a finder, displays the image picked up by the imaging portion 10 along with the state of the battery 11. A control portion 13 performs processing related to image data generated by the imaging portion 10, processing related to the information indicating the state of the battery 11 and processing related to the image signal output to the display portion 12.

The battery 20 supplies driving power to each portion in the recording device 2. A control portion 21 performs processing related to image data output from the camera 1 and input via an interface not shown, processing related to information showing the state of the battery 20, and processing related to the remaining operating time of the camera 1 and the remaining operating time of the recording device 2. A display portion 22 displays the remaining operating time B of the recording device 2. A remainder comparing portion 23 compares the remaining operating time A and the remaining operating time B and outputs the comparison result to the control portion 21. While there are cases of the recording device 2 not being provided with the display portion 22, the explanation given here assumes the case of the display portion 22 being provided.

The combining portion 7 generates data for displaying the remaining operating time based on the information indicating the remaining operating time A or the information indicating the remaining operating time B, combines the data with image data output from the recording device 2, and outputs it to the monitor 3. The monitor 3 displays an image based on the data combined by the combining portion 7.

Next, operation of the battery monitoring system of the aforementioned constitution is explained. The imaging portion 10 images the subject, generates image data that constitutes a moving image and outputs it to the control portion 13. The control portion 13 then outputs the image data generated by the imaging portion 10 to the recording device 2 via the interface. The control portion 13 detects the voltage of the battery 11, calculates the remaining capacity of the battery 11 based on the detected voltage, and calculates the remaining operating time A based on this remaining capacity. The control portion 13 combines the display data, for displaying the remaining capacity and the remaining operating time A of the battery 11 in the display portion 12, with the image data. Based on the combined data, it then generates an image signal for driving the display circuit in the display portion 12 and outputs it to the display portion 12. In addition, the control portion 13 outputs information indicating the remaining operating time A to the recording device 2 via the interface.

The control portion 21 of the recording device 2 stores image data input via the interface in a storage unit such as a hard disk drive not shown and outputs it to the combining portion 7 via another interface not shown. Also, the control portion 21 detects the voltage of the battery 20 and calculates the remaining capacity and the remaining operating time B of the battery 20 based on this voltage. The control portion 21 creates display data for displaying the remaining operating time B in the display portion 22 and, based on this display data, generates a display signal for driving the display circuit in the display portion 22 and outputs it to the display portion 22. The display portion 22 then displays the remaining operating time B based on the display signal.

The control portion 21 outputs information indicating the remaining operating time A input via the interface and information indicating the remaining operating time B to the remaining capacity comparing portion 23. The remaining capacity comparing portion 23 compares the remaining operating time A and the remaining operating time B. Since the remaining operating time A here is 30 minutes and the remaining operating time B is 50 minutes, the remaining capacity comparing portion 23 notifies the control portion 21 of information that the remaining operating time A is less than the remaining operating time B. Based on the information notified by the remaining capacity comparing portion 23, the control portion 21 then selects the information indicating the remaining operating time A, which is the lesser of the two, and outputs it to the combining portion 7.

The combining portion 7 generates data for displaying the remaining operating time A based on the information showing the remaining operating time A output from the recording device 2, combines the data with image data output from the recording device 2, and outputs it to the monitor 3. The monitor 3 displays an image based on the image data output from the combining portion 7. The monitor 3 shows that the remaining operating time for the entire system is 30 minutes. As shown in FIG. 2, the remaining capacity of the battery 11 of the camera 1, which has the lower remaining operating time, may be shown in the monitor 3 by a battery icon or the like. Also, besides displaying a number or icon by image synthesis, the remaining operating time may be displayed with a separate LCD panel, shown with lamps such as LEDs or communicated by sound.

In the present embodiment, comparison of the remaining operating times is performed by the remaining capacity comparing portion 23 in the recording device 2, but 5 when the camera 1 receives the data that the control portion 21 controls, comparison of the remaining operating times may be performed in the camera 1. Also, similarly to the first embodiment, comparison of the remaining operating times may also be performed in an external unit other than the camera 1 and the recording device 2.

Figure 3:
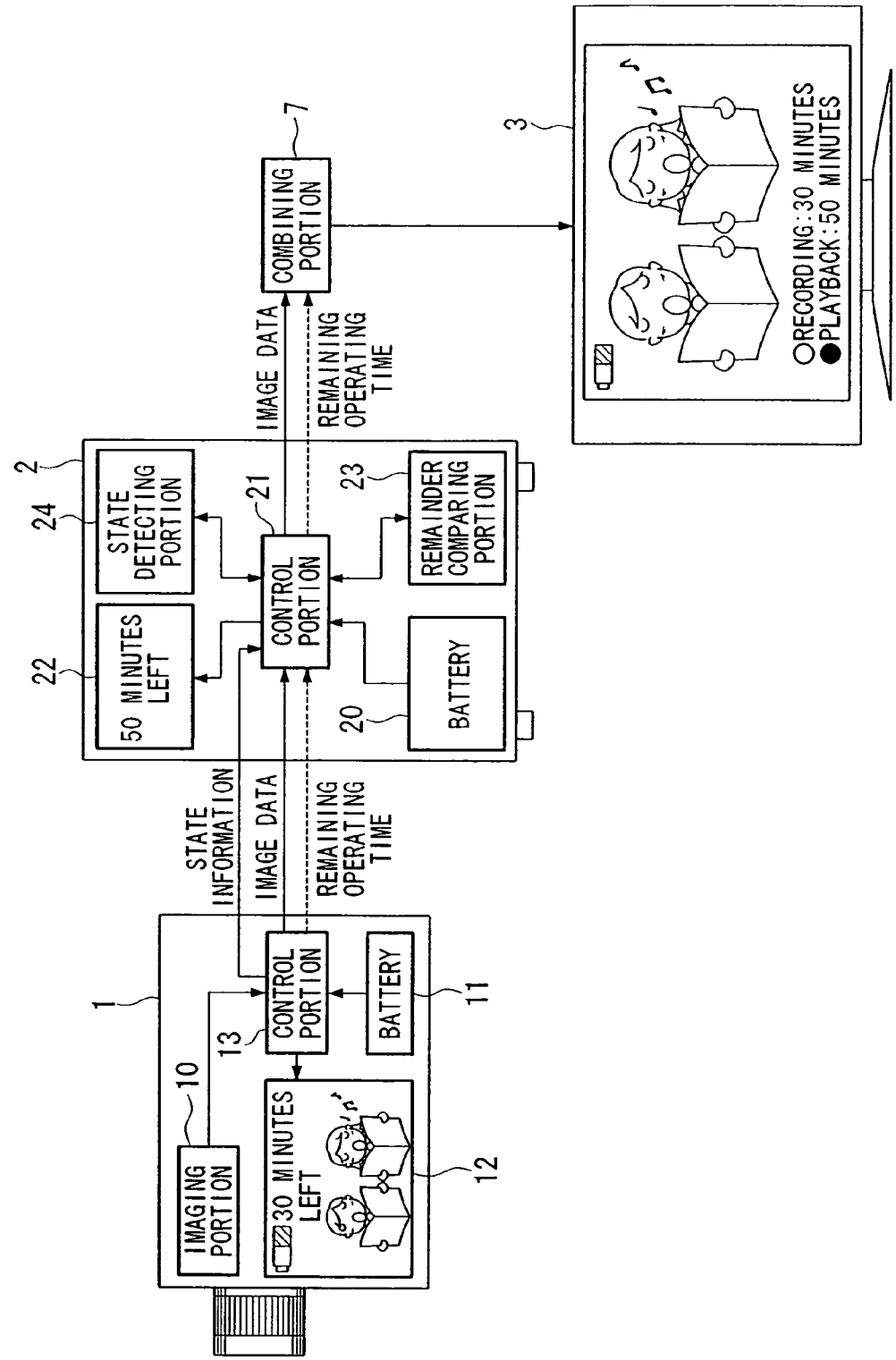
FIG. 3 is a block diagram showing the constitution of the battery monitoring system according to a third embodiment of the present invention.

Next, a third embodiment of the present invention is explained. FIG. 3 is a block diagram showing the constitution of the battery monitoring system according to this embodiment. In the explanation given below, the same constituent elements as those in the second embodiment explained using FIG. 2 are denoted by the same reference numerals, and so their explanation is omitted. In the present embodiment, the remaining operating time A of the camera 1 with the battery 11 is 30 minutes, while the remaining operating time B of the recording device 2 with the battery 20 is 50 minutes.

In the present embodiment, a state detecting portion 24 is provided in the recording device 2. The state detecting portion 24 detects the operating state of the camera 1 and the recording device 2 and, based on the operating states of these two devices, detects the operating mode of the entire system including the camera 1 and the recording device 2 and outputs this detection result to the control portion 21. Based on the result of comparing the remaining operating times by the remaining capacity comparing portion 23 and the result of detecting the operating states by the state detecting portion 24, the control portion 21 selects one of the remaining operating time A of the camera 1 and the remaining operating time B of the recording device 2 and outputs it.

The operating states of the camera 1 and the recording device 2 are detected as follows. When an operating switch, not shown, of the recording device 2 is operated by the user, information indicating the state of the operating switch is input to the state detecting portion 24, which detects the state of the recording device 2 based on this information. Also, state information indicating the operating state of the camera 1 (information indicating that the camera 1 is turned on or recording and the like) in the camera 1, is output from the control portion 13 in the camera 1. The control portion 21 obtains this state information via the interface and outputs it to the state detecting portion 24.

The state detecting portion 24 detects the operating mode of the entire system including the camera 1 and the recording device 2 based on information indicating the operating states of the camera 1 and the recording device 2. For example, when the recording device 2 records image data from the camera 1, the record button on the record device 2 is operated by the user. Information indicating the operation of the record button is output to the state detecting portion 24. The state detecting portion 24 detects that the camera 1 and the recording device 2 are both operating and that the recording device 2 has started recording image data, and, by doing so, detects that the operating mode of the system is the mode to record image data. The state detecting portion 24 outputs information indicating the operating mode of the system to the control portion 21.

When the operating mode of the system is the mode to record image data, since the remaining operating time A of the camera 1 (30 minutes) is less than the remaining operating time B of the recording device 2 (50 minutes), the remaining operating time of the system is 30 minutes. Based on the result of comparing the remaining operating times by the remaining capacity comparing portion 23 and the result of detecting the operating mode of the system by the state detecting mode 24, the control portion 21 selects the information indicating the remaining operating time A of the camera 1 and outputs it to the combining portion 7.

When the recording device 2 plays back image data recorded on a hard disk drive and the like, not shown, that is provided therein, the playback button on the recording device 2 is operated by the user. Information indicating the operation of this playback button is output to the state detecting portion 24. The state detecting portion 24 detects that the camera 1 and the recording device 2 are both operating and detects that the recording device 2 has started playback of image data, and, by doing so, detects that the operating mode of the system is the mode to play back image data. The state detecting portion 24 then outputs information indicating the operating mode of the system to the control portion 21.

When the operating mode of the system is the mode to play back image data, the remaining operating time of the system is 50 minutes, which is the remaining operating time B of the recording device 2. Based on the result of detecting the operating mode of the system by the state detecting portion 24, the control portion 21 selects the information indicating the remaining operating time B of the recording device 2 and outputs it to the combining portion 7.

When focusing or color adjustment of the camera 1 is performed by the user, the state detecting portion 24 detects that the camera 1 and the recording device 2 are both operating and that the recording device 2 is neither recording nor playing back image data, and outputs the detection result to the control portion 21. When focusing or color adjustment of the camera 1 is performed, the remaining operating time of the system is 30 minutes, the remaining operating time A of the camera 1. Based on the result of detecting the operating mode of the system by the state detecting portion 24, the control portion 21 selects information indicating the remaining operating time A of the camera 1 and outputs it to the combining portion 7.

As explained above, the remaining operating time of the system is detected and, similarly to the second embodiment, information indicating the remaining operating time is displayed on the monitor 3. In the example shown in FIG. 3, both the remaining operating time in the case of the system operating mode being the mode to record image data and the remaining operating time in the case of it being the mode to play back image data are displayed, with the mode to play back image data currently highlighted. Of course, only the remaining operating time of the system in the current mode may be displayed. The camera 1 may also be provided with a constitution corresponding to the state detecting portion 24, and external equipment other than the camera 1 and the recording device 2 may also be provided with it.

Figure 4:
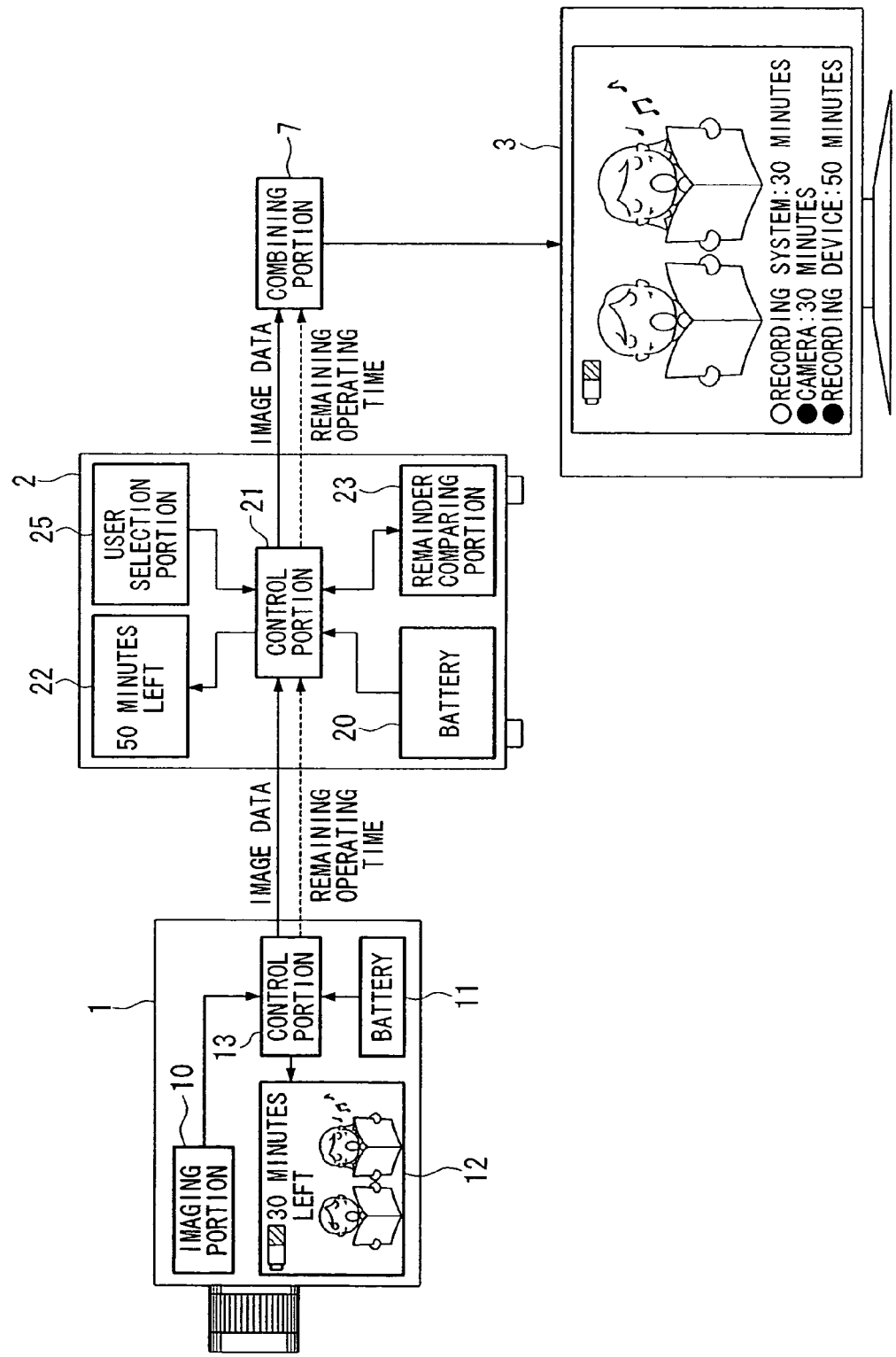
FIG. 4 is a block diagram showing the constitution of the battery monitoring system according to a fourth embodiment of the present invention.

Next, a fourth embodiment of the present invention is explained. FIG. 4 is a block diagram showing the constitution of the battery monitoring system according to this embodiment. The same constituent elements as those in the second embodiment explained using FIG. 2 and the third embodiment explained using FIG. 3 are denoted by the same reference numerals, and so their explanation is omitted. In the present embodiment, the remaining operating time A of the camera 1 with the battery 11 is 30 minutes, while the remaining operating time B of the recording device 2 with the battery 20 is 50 minutes.

In the present embodiment, a user selection portion 25 is provided in the recording device 2. The user selection portion 25 is provided with a switch or the like not shown and outputs a signal indicating the operation result by the user to the control portion 21. By operating the user selection portion 25, the user can instruct the display of the remaining operating time of the camera 1 and the recording device 2 for each device. For example, in the case of the user indicating the display of both the remaining operating time of the camera 1 and the remaining operating time of the recording device 2 by operating the user selection portion 25, the user selection portion 25 outputs information indicating the operation result by the user to the control portion 21.

Similarly to the second and third embodiments, the control portion 21 selects information indicating the remaining operating time of the system based on the result of comparing the remaining operating times by the remaining capacity comparing portion 23 and selects information indicating the remaining operating time indicated by the user based on the information output from the user selection portion 25. In this case, the control portion 21 outputs information indicating the remaining operating time of the camera 1 as information indicating the remaining operating time of the system and also outputs information indicating the remaining operating times of the camera 1 and the recording device 2 to the combining portion 7.

As explained above, similarly to the second and the third embodiments, information indicating the remaining operating time is displayed in the monitor 3. In the example of FIG. 4, the remaining operating time of the entire system, the remaining operating time A of the camera 1 and the remaining operating time B of the recording device 2 are displayed. Doing so enables the user to know the remaining operating time of the system and which device has the shortest remaining operating time. The camera 1 may also be provided with a constitution corresponding to the user selection portion 25, and the camera 1 and external equipment other than the camera 1 and the recording device 2 may also be provided with it.

Figure 5:
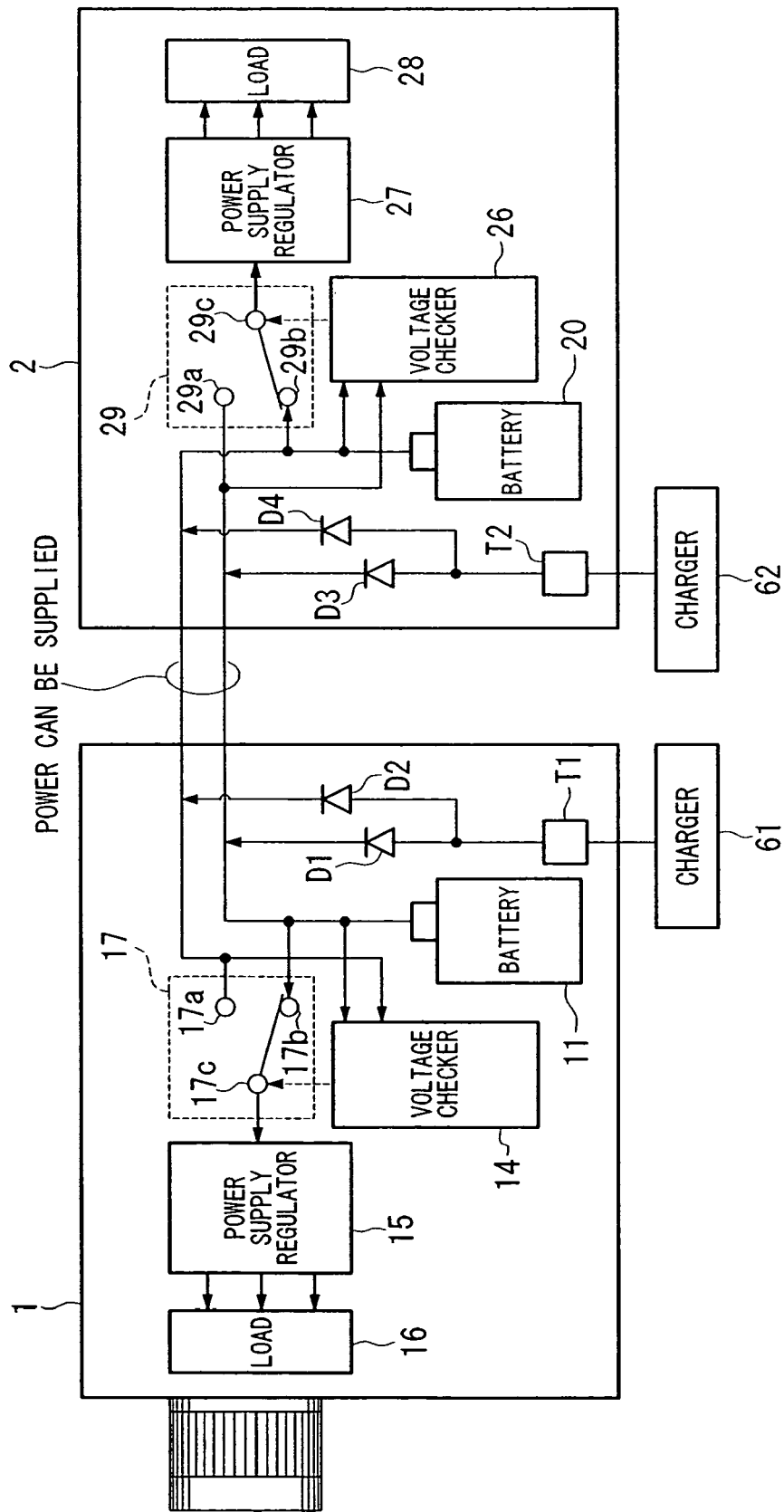
FIG. 5 is a block diagram showing the constitution of the battery monitoring system according to a fifth embodiment of the present invention.
Figure 6:
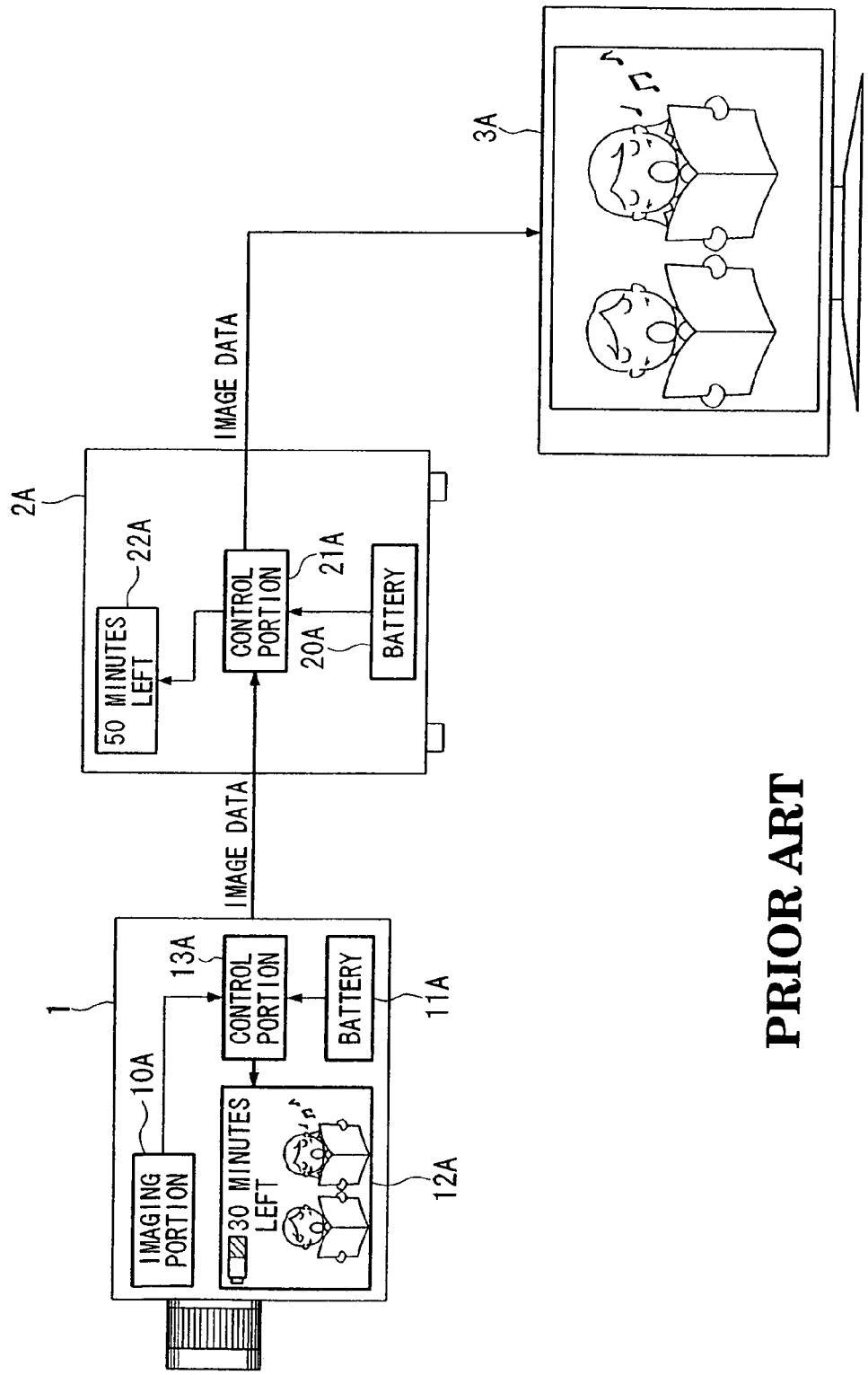
FIG. 6 is a block diagram showing the schematic structure of a conventional imaging system.

Next, a fifth embodiment of the present invention is explained. FIG. 5 is a block diagram showing the constitution of the battery monitoring system according to this embodiment. The same constituent elements as those in the second to fourth embodiments explained using FIGS. 2 to 4 are denoted by the same reference numerals, and so their explanation is omitted. Below, each constitution in the drawing is explained. Battery 11 supplies driving power to each portion in the camera 1 via a switch 17 and supplies driving power to each portion in the recording device 2 via a switch 29 provided in the recording device 2. The battery 20 of the recording device 2 supplies driving power to each portion of the recording device 2 via the switch 29 and supplies driving power to each portion in the camera 1 via the switch 17 provided in the camera 1.

A voltage checker 14 in the camera 1 monitors the voltages of the battery 11 and the battery 20 and, based on these voltages, switches the connection of the switch 17. A power supply regulator 15 converts the voltage supplied from the battery 11 or the battery 20 to the voltage required for operation of the camera 1. A load 16 is the load required for operation of the camera 1. The switch 17 switches the connection to that between a terminal 17a and a terminal 17c, or to that between a terminal 17b and the terminal 17c, thereby making the connection between the power source regulator 15 and either the battery 11 or the battery 20.

A charging terminal T1 is a terminal provided in the camera 1 for connection to a charger. During charging, a charger 61 is connected to the charging terminal T1, and power is supplied from a commercial power supply. The input power is supplied to the battery 11 and the battery 20 by a diode D1 and a diode D2, respectively.

A voltage checker 26 in the recording device 2 monitors the voltages of the battery 11 and the battery 20 and, based on these voltages, switches the connection of the switch 29. A power supply regulator 27 converts the voltage supplied from the battery 11 or the battery 20 to the voltage required for operation of the recording device 2. A load 28 is the load required for operation of the recording device 2. A switch 29 switches the connection to that between a terminal 29a and a terminal 29c, or to that between a terminal 29b and the terminal 29c, thereby making the connection between the power source regulator 27 and either the battery 11 or the battery 20.

A charging terminal T2 is a terminal provided in the recording device 2 for connection to a charger. During charging, a charger 62 is connected to the charging terminal T2, and power is supplied from a commercial power supply. The input power is supplied to the battery 11 and the battery 20 by a diode D3 and a diode D4, respectively. FIG. 5 omits illustration of some of the constituent elements shown in FIGS. 1 to 4, but the voltage monitoring system of the present embodiment has the same function as the voltage monitoring systems explained in any one of embodiments 2 to 4.

The operation of the battery monitoring system of the present embodiment is now explained. In the initial state, the terminal 17b and the terminal 17c in the switch 17 are connected, and the terminal 29b and the terminal 29c in the switch 29 are connected. By detecting the battery terminal voltages of the battery 11 and the battery 20, the voltage checker 14 monitors the capacities of the batteries. When the remaining capacity (or voltage) of the battery 11 satisfies the battery capacity (or voltage) required for operation of the camera 1, the current connection in the switch 17 is maintained.

When the remaining capacity of the battery 11 is less than the battery capacity required for operation of the camera 1, that is, when the remaining capacity of the battery 11 is low enough to affect operation of the camera 1, the voltage checker 14 judges whether the remaining capacity (or voltage) of the battery 20 in the recording device 2 satisfies the battery capacity (or voltage) required for operation of the camera 1. If judged as satisfying the battery capacity (or voltage) required for operation of the camera 1, the voltage checker 14 instructs the switch 17 to switch connections.

Based on this instruction, the switch 17 connects the terminal 17a and the terminal 17c. Doing so causes power to be supplied from the battery 20 to the camera 1, so that the camera 1 can be supplied with the power required for operation of the portions in the camera 1. When the remaining capacity (or voltage) of the battery 20 does not satisfy the battery capacity (or voltage) required for operation of the camera 1, the voltage checker 14 does not instruct the switch 17 to switch connections. In this case, a display portion not shown prompts the user to commence charging. The above explanation mainly covers the case centered on the operation of the camera 1, but the case centered on the operation of the recording device 2 is the same.

During charging, in the state of the charger 61 being connected to the terminal T1 of the camera 1, or the charger 62 being connected to the terminal T2 of the recording device 2, both the battery 11 and the battery 20 can be charged.

In the present embodiment, the remaining operating times of the camera 1 and the recording device 2 may be calculated based on the voltages of the battery 11 and the battery 20 provided in the respective devices or may be calculated based on the remaining capacities of the battery 11 and the battery 20 calculated from their voltages.

The present embodiment explained a system provided with a plurality of devices having batteries, taking an imaging system as an example, but it is not necessarily limited thereto. In addition, there may be three or more devices provided with batteries, and in the case of there being three devices, control actions may be performed such as selecting and outputting the remaining operating time of the batteries in two of the devices.

According to the first embodiment explained above, the states of batteries in a plurality of battery-powered devices can be easily monitored by generating information relating to the remaining operating times of the batteries of the plurality of devices, comparing the information relating to the remaining operating time of each battery, and selecting and outputting at least one of the information relating to the remaining operating time, thereby preventing erroneous judgment by a user.

According to the second embodiment, by comparing the remaining operating times of a plurality of devices, selecting and outputting the remaining operating time of the device having the least remaining operating time, and displaying information indicating that remaining operating time, the user is freed from the troublesome procedure of checking the remaining capacities of the batteries of a plurality of devices and no longer overlooks the device with the lowest remaining capacity, thereby preventing erroneous judgment by a user.

According to the third embodiment, an imaging system provided with a camera and a recording device detects the operating states of the camera and the recording device. When recording image data, the remaining operating time of the camera and the remaining operating time of the recording device are compared, and the lower of the two is selected and displayed. During playback of the image data, the remaining operating time of the recording device is selected and displayed. In addition, when only the camera is being operated in order to perform focusing or color adjustment of the camera, the remaining operating time of the camera is selected and displayed. Such operations enable presentation to the user of the remaining operating time corresponding to the operating mode when operating the camera and the recording device in coordination.

According to the fourth embodiment, by selecting and displaying the remaining operating time of the device instructed by the user, the user can check the remaining operating time of the system and the remaining operating time of each device, and so can find out which device has a short remaining operating time.

According to the fifth embodiment, in the case of the remaining capacity (or voltage) of a device decreasing to less than a predetermined amount while monitoring the remaining capacity of (or voltage) of each device, power from the battery of another device can be supplied. Therefore, even if the remaining capacity of a battery mounted in a device runs down, the operation of the entire system is not affected and can continue.

While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

What is claimed is:

1. A battery monitoring system comprising:
   a camera powered by a first battery;
   a recording device which records an image data imaged by the camera and powered by a second battery, the recording device being operated in conjunction with the camera and separated from the camera;
   a first information generating portion that generates a first information indicating the remaining operating time of the camera by the first battery;

a second information generating portion that generates a second information indicating the remaining operating time of the recording device by the second battery;

an information selecting portion that compares the first information and the second information and selects and outputs at least one of the first information and the second information based on a predetermined condition; and a display section that displays at least one of the first information and the second information output from the information selecting portion, wherein:

when the battery monitoring system is in a recording mode in which the recording device records the image data from the camera, the predetermined condition is made by selecting and outputting the lower one of the first information and the second information; and when the battery monitoring system is in a playing mode in which the image data recorded in the recording device is playing, the predetermined condition is determined by always selecting and outputting the second information.

2. The battery monitoring system according to claim 1, further comprising a power source switching portion that supplies power from the second battery to the camera when the remaining capacity of the first battery is below a predetermined amount, and supplies power from the first battery to the recording device when the remaining capacity of the second battery is below a predetermined amount.

* * * * *